United States Patent [19]

Romania et al.

[11] Patent Number: 4,631,637

[45] Date of Patent: Dec. 23, 1986

[54] DUAL BACKPLANE INTERCONNECT SYSTEM

[75] Inventors: Samuel R. Romania, Phoenixville; Grant F. Steen, Bryn Athyn, both of Pa.

[73] Assignee: Burroughs Corporation, Detroit, Mich.

[21] Appl. No.: 812,834

[22] Filed: Dec. 23, 1985

[51] Int. Cl.⁴ .............................................. H01R 23/68
[52] U.S. Cl. ............................... 361/413; 339/17 LC; 339/17 LM; 339/17 M; 361/404; 361/415
[58] Field of Search ........................ 361/404, 412–415, 361/419; 339/17 LC, 17 C, 17 LM, 17 M

[56] References Cited

U.S. PATENT DOCUMENTS

| | | | |
|---|---|---|---|
| 3,648,115 | 3/1972 | Teagno | 361/413 X |
| 4,094,568 | 6/1978 | Lee et al. | 339/17 LM |
| 4,363,530 | 12/1982 | Verhoeven | 339/17 C |
| 4,530,553 | 7/1985 | Aujla | 339/17 LC |

OTHER PUBLICATIONS

Pinter, J., "Cable Retainer", IBM Tech. Disl. Bul., vol. 20, No. 1, Jun. 1977, p. 88.

Primary Examiner—Arthur T. Grimley
Assistant Examiner—Jane K. Lau
Attorney, Agent, or Firm—Francis A. Varallo; Mervyn L. Young; Kevin R. Peterson

[57] ABSTRACT

The present disclosure describes a connector system for making electrical connections between connectors disposed at opposite extremities of a logic board to conductors in a respective pair of parallel, spaced-apart backplanes. Movable pin headers containing respective pluralities of pins are disposed on the outer surfaces of the backplanes. The pin headers are capable of assuming either a retracted or an extended position. In the former, the pins offer no interference to the insertion or removal of the logic board between the backplanes. In the latter, the pins traverse both feed-through holes in the backplanes and feed-through socket affixed to the opposed interior surfaces of the respective backplanes to electrically engage the connectors of the logic board, thereby completing circuit paths between the respective backplanes and the logic board.

6 Claims, 5 Drawing Figures

DUAL BACKPLANE INTERCONNECT SYSTEM

BACKGROUND OF THE INVENTION

Present day electronic systems, such as those employed for data processing, utilize a packaging arrangement having a single backplane (mother board) and a plurality of logic boards, sometimes referred to as daughter boards. The surface of the backplane includes a plurality of connectors into which respective logic boards are plugged in orthogonal relation to said surface. As such electronic systems become more complex, the task of routing electrical signals and of increasing the speed of system operation becomes more arduous. To accomplish these goals, a dual backplane configuration is advantageous. Thus, a pair of parallel, spaced-apart backplanes are provided with a plurality of parallel, spaced-apart logic boards oriented at right angles to the backplanes and disposed therebetween to form a card rack. However, it is apparent that such a configuration poses a unique interconnection problem. In order to make electrical connections between the opposite extremities of each logic board and the respective backplanes, it is necessary that means be provided to permit the logic board to slide into position between the backplanes. Once the logic board is in place, the connector system must be actuated to make the electrical connections.

Connector systems have been developed in the industry for use with dual backplanes. One such system is described by Fujitsu Limited of Kawasaki, Japan in a technical paper entitled "High Density Three Dimensional Stack Packaging for High Speed Computer", published in the Proceedings of the 1982 32nd Electronics Components Conference" relative to the "Components, Hybrids and Manufacturing Technology Society" program. As seen particularly in FIG. 9, page 452 of the Proceedings, the Fujitsu system is based upon the surface mounting of pin contacts on both the backplanes and at opposite extremities of the logic boards. Electrical connections are made via movable, double position, female connectors. Initially, the movable connectors are installed such that they engage only the pins emanating from male connectors disposed on the interior facing surfaces of the respective backplanes. In the installed position, the movable female connectors are slid into contact with the male backplane connectors. The logic boards with pins emanating from male connectors mounted on opposite extremities thereof are positioned relative to the homologously disposed pins on the respective backplanes. The female connectors are then moved toward the logic board pins which enter the connectors, such that the contacts of the female connector bridge both male connectors.

The system described by Fujitsu uses connectors which have a very small pin pitch and this has resulted in significant alignment and registration problems. Additionally, the sliding connectors mounted on the respective interior surfaces of the dual backplanes require considerably more space in this area than conventional connectors and the signal paths via the connector pins are considerably longer than optimum. The latter is an important consideration in high speed system operation. Finally, the cam mechanism taught by Fujitsu in the reference paper is located inside the card rack thereby limiting access to the mechanism for maintenance and repairs.

What is described is a dual backplane configuration system, which eliminates the foregoing deficiencies of the Fujitsu system, is economical, and relatively simple to implement. The pin-through-backplane connector system of the present invention fills such a need.

SUMMARY OF THE INVENTION

In accordance with the present invention, there is provided a card rack assembly comprised of a pair of parallel, spaced-apart backplanes, a plurality of feed-through sockets affixed to the interior, that is, facing surfaces of the respective backplanes, pin header housings affixed to the exterior surface of the respective backplanes in corresponding relation to the feed-through sockets, and movable pin headers disposed in the last mentioned housings.

More specifically, the dual backplanes have respective pluralities of feed-through holes disposed therein—the holes in one backplane being homologously oriented with respect to those in the other backplane. The feed-through sockets are mounted such that their electrical contacts are in alignment with the feed-through holes. Similarly, the pin header housings are located in the outside of the backplanes directly opposite to the respective inside mounted feed-through sockets. Thus, the pins of the movable pin header disposed in each of the housings, are registered with and traverse the backplane by way of the through holes entering the electrical contacts of the feed-through sockets.

In operation, the logic boards to be disposed in the card rack are each fitted with surface mount female connectors at the respective opposite ends of the board. The feed-through sockets include a "U"-shaped channel which serves as a guide for the board connectors. Before a board is slid into the card rack, the pins of the movable pin header are retracted such that their extremities lie below the socket channel guides Therefore, as the logic board is slid into position, no interference between the connector and the header pins will be encountered. When a logic board is in position such that the contacts of its female connectors are in alignment with the contacts of the feed-through sockets, the corresponding pin headers on the opposite backplanes are actuated. That is, the movable headers are each pushed toward the outer backplane surfaces, thereby causing the pins to engage the contacts of the logic board connectors. To remove a logic board from the card rack, the procedure is reversed Namely, the header pins are withdrawn from both logic board connectors and the board may be removed from the rack.

As compared, for example, with the reference Fujitsu configuration, the present system offers at least the following advantages. Since the movable pin headers and their associated housings are external to the card rack, being disposed on the outer surfaces of the dual backplanes, they are easily removable therefrom for repair or routine maintenance. The accessibility of the movable header permits the easy insertion and extraction of the pins during operation by simple manual or mechanical means. Most significant is the fact that since only the pins of the header extend into the interconnect area, the electrical paths from the backplane to the logic board are optimally short—an essential for high speed operation. Also, the present system permits the use of pin headers with large groups of pins, eliminating potential difficulties involved in large numbers of smaller units. Finally, the larger pin sizes and grid configuration used in the present system minimize alignment and registration problems among the system components.

Other features and advantages of the present invention will become apparent in the detailed description thereof which follows.

DETAILED DESCRIPTION OF THE PREFERRED EMBODIMENT

Figure 1:
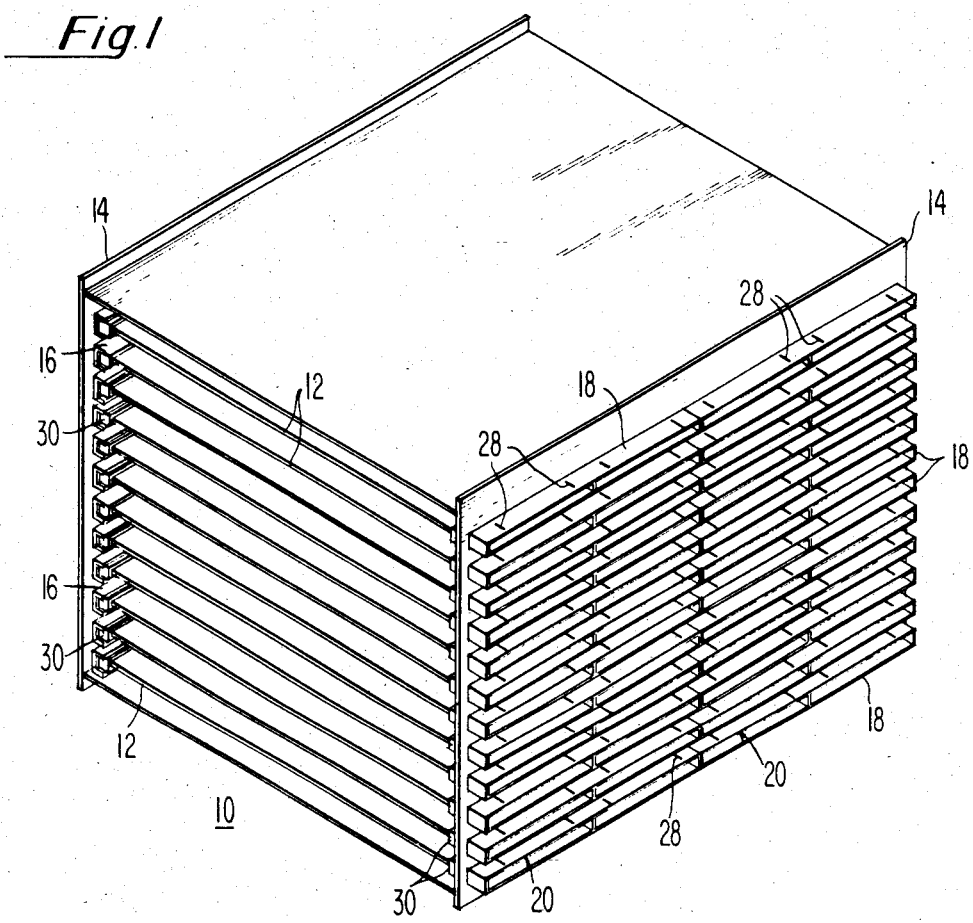
FIG. 1 is a pictorial view of the dual backplane system of the present invention.
Figure 2:
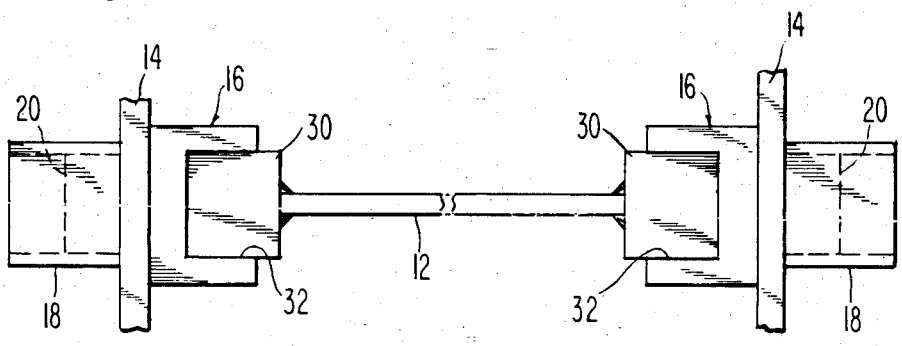
FIG. 2 is an edge view of one of the logic boards of FIG. 1 shown interconnected to a pair of backplanes as contemplated by the present invention.
Figure 3:
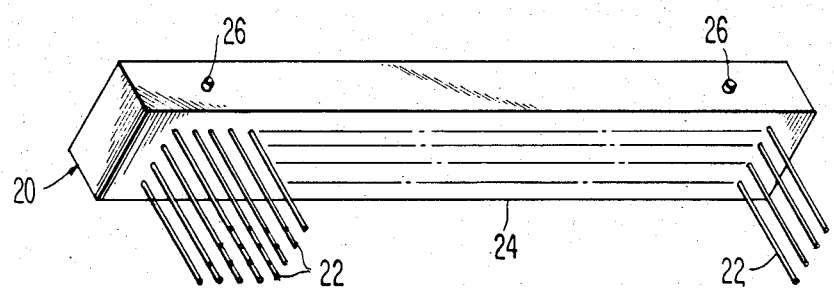
FIG. 3 is a pictorial view of a movable pin header.

FIG. 1 illustrates in pictorial fashion a card rack 10 utilizing the pin-through-backplane interconnections of the present invention FIG. 2 provides more details o±the component assemblies utilized with each of the loqic boards 12 of FIG. 1. With reference to FIGS. 1 and 2, a card rack 10 includes a pair of backplanes 14. Affixed to the inside surfaces of the respective backplanes 14 are a plurality of feed-through sockets 16. In like positions, but situated on the outside surfaces of the respective backplanes 14, are pin header housings 18. Four housings 18 are depicted in each row, in two groups of two housing units. It is assumed that a like number of feed-through sockets 16 are also present. The housings 18 accommodate the pin headers 20 depicted in FIG. 3. The headers 20 each comprise a plurality of pins 22 mounted in a base 24 of electrically insulative material. As will be described in detail hereinafter, the pin header 20 is movable within housing 18 by virtue of the disposition of the protuberances 26 on the base 24 of the header 20 within the slots 28 formed on opposite sides of the housing 18. It is the function of the pin header 20 to effect electrical connections between the backplane 14 and the logic board 12.

In FIG. 2, the logic board 12 to be disposed in the card rack 10 is fitted with surface mount female connectors 30 at respective opposite ends of the board 23. The feed-through socket 16 includes a "U"-shaped channel which serves as a guide for the board connectors 30.

Figure 4:
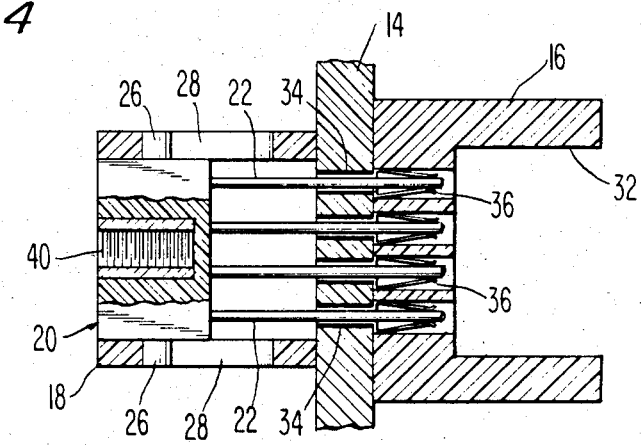
FIG. 4 illustrates in cut away fashion the assembly of components disposed on one of the backplanes of FIG. 1 prior to the engagement of one extremity of a logic board.
Figure 5:
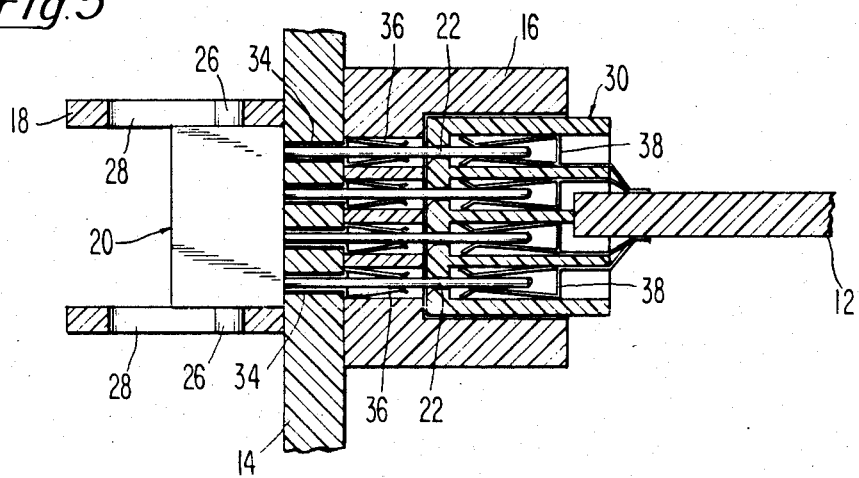
FIG. 5 illustrates the movement of the pin header of FIG. 3 into engagement with the electrical contacts of a surface mount connector at one extremity of a logic card.

FIGS. 4 and 5 provide additional insight into the present system. As seen in the last mentioned figures, each of the backplanes 14 have pluralities of metal-plated feed-through holes 34. Although not shown in the drawing, the backplane 14 is commonly a multilayer printed circuit board and it may be assumed that predetermined electrical connections have been effected among the various conductors in such layers with the metallic lining of the feed-through holes. The feed-through holes 34 in one backplane 14 are homologously arranged with respect to those in the opposite backplane.

The feed-through socket 16 is affixed to the interior surface of the backplane 14. The electrical contacts 36 of each of the sockets 16 are terminated to the respective metal sides of the feed-through holes 34 in the backplane 14 by reflow soldering. The pin header housing 18 is affixed to the outer surface of the backplane 14, directly opposite the feed-through socket 16. In FIG. 4, the pin header 20 with its plurality of pins 22 is shown in a retracted position, that is, the pins 22 penetrate the backplane 14 and engage the contacts 36 of the feed-through socket 16 but do not exit the latter.

In operation, with additional reference to FIG. 5, the board 12 with its surface mount connectors 30 is slid into the card rack 10—the connectors sliding within the "U"-shaped channels 32 without danger of impacting any of the pins 22 of the header 20. When the logic board 12 is in the desired position, such that the contacts 38 of the female connectors 30 are aligned with the pins 22, the pin headers 20 are moved toward the respective backplanes 14 on which they are mounted. The pins 22 engage the contacts 38 of the logic board connectors 30, effecting a current path from the backplane 14 to the connector 30. To remove a logic board 12 from the card rack 10, the corresponding pair of pin headers 20 are moved to their original positions wherein the pins 22 are in a retracted position. To effect pin retraction, the base of the pin header includes a threaded bushing 40 for receiving a suitable appendage (not shown), such as a knob or pull. The actual form of the appendage will depend upon whether the extraction is to be performed manually or by mechanical means.

In conclusion, there has been disclosed an interconnection system for use with dual backplanes. It should be understood that depending upon the particular application, changes and modifications of the system may be required. For example, the number of pin header housings 18 and corresponding feed-through connectors 16 illustrated in FIG. 1 are depicted solely for purposes of description and the invention is not to be construed as limited to this arrangement. Also, while the electrical contacts 36 of the feed-through connectors 16 are shown as being reflow soldered to the plated-through holes 34 in the backplane 14, the feed-through connector may take other forms. For example, the last mentioned connector may be of the surface mount type wherein connections are made directly to the surface wiring on the backplane and to the subsurface conductors of the latter through plated via holes. In this case, the through holes in the backplane may be of the insulated variety, rather than the plated type. As to the pin header 20 of FIG. 3, the pins 22 have a 0.025 square cross section, and are arranged in a 4×40 (160 position) pattern on 0.10 inch by 0.10 inch centers. Other sizes of pins, and different configurations, may be needed to suit particular system requirements. Such changes and modifications insofar as they are not departures from the true scope of the invention, are intended to be covered by the claims which follow.

What is claimed is:

1. A dual backplane interconnect system comprising in combination:
    a pair of backplanes disposed in parallel, spaced-apart relation, each of said backplanes having at least a set of feed-through holes formed therein, the respective sets of feed-through holes of said pair of backplanes being homologously oriented with respect to each other,
    a plurality of female feed-through sockets each having a plurality of electrical contacts, said feed-through sockets being affixed respectively to the interior opposing surfaces of said pair of backplanes, and overlying said sets of feed-through holes, said electrical contacts of said feed-through sockets being aligned respectively with said feed-through holes, a plurality of pin header housings, each of said pin header housings being affixed to an exterior surface of one of said backplanes in direct positional relation to a corresponding feed-through socket, a plurality of pin headers each having a plurality of pins, each of said pin headers being movably disposed within a pin header housing, said pins being registered with said feed-through holes in said backplanes, said pins engaging said electrical contacts of said feed-through sockets via said feed-through holes, the extremities of said pins being retained within said feed-through sockets when said pin header is in a retracted position and being extended beyond said electrical contacts of said sockets when said pin header is in an extended position, at least one logic board having female connectors at respective opposite extremities thereof, each of said female connectors having a plurality of electrical contacts, said retracted position of the pin headers permitting the unimpeded alignment of said electrical connectors with a pair of feed-through sockets on the respective backplanes, whereupon the movement of the pin headers to said extended position effects the engagement of said pins with the electrical contacts of said female connectors of said logic board.

2. A dual backplane interconnect system as defined in claim 1 further characterized in that each of said feed-through sockets includes a 'U'-shaped channel for receiving said connectors of said logic board, whereby said board may be slid into said alignment relative to said feed-through sockets when said pin headers are in said retracted position, said logic board being oriented perpendicular to said backplanes.

3. A dual backplane interconnect system as defined in claim 2 wherein said pin header includes a base of insulative material, said pins being embedded in said material, a plurality of protuberances formed on opposite sides of said base, said pin header housing being formed with slots on opposite sides thereof for accommodating said protuberances, whereby the movement of said pin header is guided in a direction perpendicular to said backplanes.

4. A dual backplane interconnect system as defined in claim 3 wherein said feed-through holes in said backplanes are plated with metallic material, the electrical contacts of said feed-through sockets being joined to said material, whereby the electrical contacts of the connectors at the opposite extremities of said logic board are electrically connected via said pins to the respective plated feed-through holes in said pair of backplanes.

5. A dual backplane interconnect system as defined in claim 4 characterized in that said female connectors disposed at opposite extremities of said logic board are of the surface mount type.

6. A dual backplane interconnect system as defined in claim 5 wherein said base of said pin header includes a threaded bushing for use in disengaging said pins from said electrical contacts of said female connectors.

* * * * *